United States Patent
Endo et al.

(10) Patent No.: US 9,620,435 B2
(45) Date of Patent: Apr. 11, 2017

(54) EVAPORATOR, COOLING DEVICE, AND ELECTRONIC DEVICE

(71) Applicant: FUJITSU LIMITED, Kawasaki-shi, Kanagawa (JP)

(72) Inventors: Atsushi Endo, Kawasaki (JP); Osamu Aizawa, Kasiwa (JP); Hideo Kubo, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 100 days.

(21) Appl. No.: 14/697,822

(22) Filed: Apr. 28, 2015

(65) Prior Publication Data

US 2015/0334876 A1 Nov. 19, 2015

(30) Foreign Application Priority Data

May 19, 2014 (JP) .................................. 2014-103456

(51) Int. Cl.
*H01L 23/427* (2006.01)
*H05K 7/20* (2006.01)
*F28D 15/02* (2006.01)

(52) U.S. Cl.
CPC ........ *H01L 23/427* (2013.01); *F28D 15/0266* (2013.01); *H05K 7/20309* (2013.01); *H01L 2924/0002* (2013.01)

(58) Field of Classification Search
CPC ........... H01L 23/427; H01L 2924/0002; F28D 15/0266; H05K 7/20309
USPC .......... 361/679.46–679.54, 688–723
See application file for complete search history.

(56) References Cited

U.S. PATENT DOCUMENTS

| 5,349,831 | A | * | 9/1994 | Daikoku | ............... | H01L 23/427 165/80.4 |
| 2001/0020365 | A1 | * | 9/2001 | Kubo | .................. | F28D 15/0266 62/1 |
| 2002/0075652 | A1 | * | 6/2002 | Berchowitz | ......... | F28D 15/0266 361/700 |
| 2005/0067155 | A1 | * | 3/2005 | Thayer | .................. | F25B 23/006 165/172 |
| 2008/0277099 | A1 | * | 11/2008 | Takamatsu | ............ | F28D 15/043 165/104.26 |
| 2011/0048676 | A1 | * | 3/2011 | Toyoda | ............... | F28D 1/05366 165/104.21 |
| 2011/0277491 | A1 | * | 11/2011 | Wu | ..................... | H01L 23/4336 62/177 |
| 2012/0137718 | A1 | * | 6/2012 | Uchida | ................. | F28D 15/043 62/259.2 |

(Continued)

FOREIGN PATENT DOCUMENTS

JP 2011-163751 A 8/2011
JP 2013-243277 A 12/2013

*Primary Examiner* — Anthony Haughton
*Assistant Examiner* — Yahya Ahmad
(74) *Attorney, Agent, or Firm* — Squire Patton Boggs (US) LLP

(57) ABSTRACT

An evaporator includes a housing in which an evaporator chamber configured to evaporate a refrigerant is formed; a heat transfer surface provided on an inner wall of the housing and having a hot area which is a part that becomes hot due to heat transferred from a heating element to the housing; and a supply port formed in the housing, opposed to the hot area and configured to eject the refrigerant supplied from a supply pipe to the hot area, wherein a narrow groove is formed in the heat transfer surface.

25 Claims, 12 Drawing Sheets

(56) References Cited

U.S. PATENT DOCUMENTS

| | | | | |
|---|---|---|---|---|
| 2012/0312504 | A1* | 12/2012 | Suzuki | H01L 23/427 165/104.21 |
| 2014/0318167 | A1* | 10/2014 | Uchida | H01L 23/427 62/259.2 |
| 2015/0168035 | A1* | 6/2015 | Kang | F25B 39/028 62/525 |
| 2016/0124474 | A1* | 5/2016 | So | F28D 15/02 361/679.52 |

* cited by examiner

EVAPORATOR, COOLING DEVICE, AND ELECTRONIC DEVICE

CROSS-REFERENCE TO RELATED APPLICATION

This application is based upon and claims the benefit of priority of the prior Japanese Patent Application No. 2014-103456, filed on May 19, 2014, the entire contents of which are incorporated herein by reference.

FIELD

The embodiments discussed herein are related to an evaporator, a cooling device, and an electronic device.

BACKGROUND

There has been known a cooling device having an evaporator configured to boil a refrigerant by heat transferred from a heating element such as an electronic device, a condenser configured to exchange heat with ambient air, and piping connecting the evaporator and the condenser to each other. Such a cooling device is disclosed in for example, Japanese Laid-open Patent Publication No. 2013-243277 or Japanese Laid-open Patent Publication No. 2011-163751.

SUMMARY

In accordance with an aspect of the embodiments, an evaporator includes a housing in which an evaporator chamber configured to evaporate a refrigerant is formed; a heat transfer surface provided on an inner wall of the housing and having a hot area which is a part that becomes hot due to heat transferred from a heating element to the housing; and a supply port formed in the housing, opposed to the hot area and configured to eject the refrigerant supplied from a supply pipe to the hot area, wherein a narrow groove is formed in the heat transfer surface.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

These and/or other aspects and advantages will become apparent and more readily appreciated from the following description of the embodiments, taken in conjunction with the accompanying drawing of which.

DESCRIPTION OF EMBODIMENTS

One embodiment of a technology disclosed by the present application is described hereinafter.

(Electronic Device 10)

Figure 1:
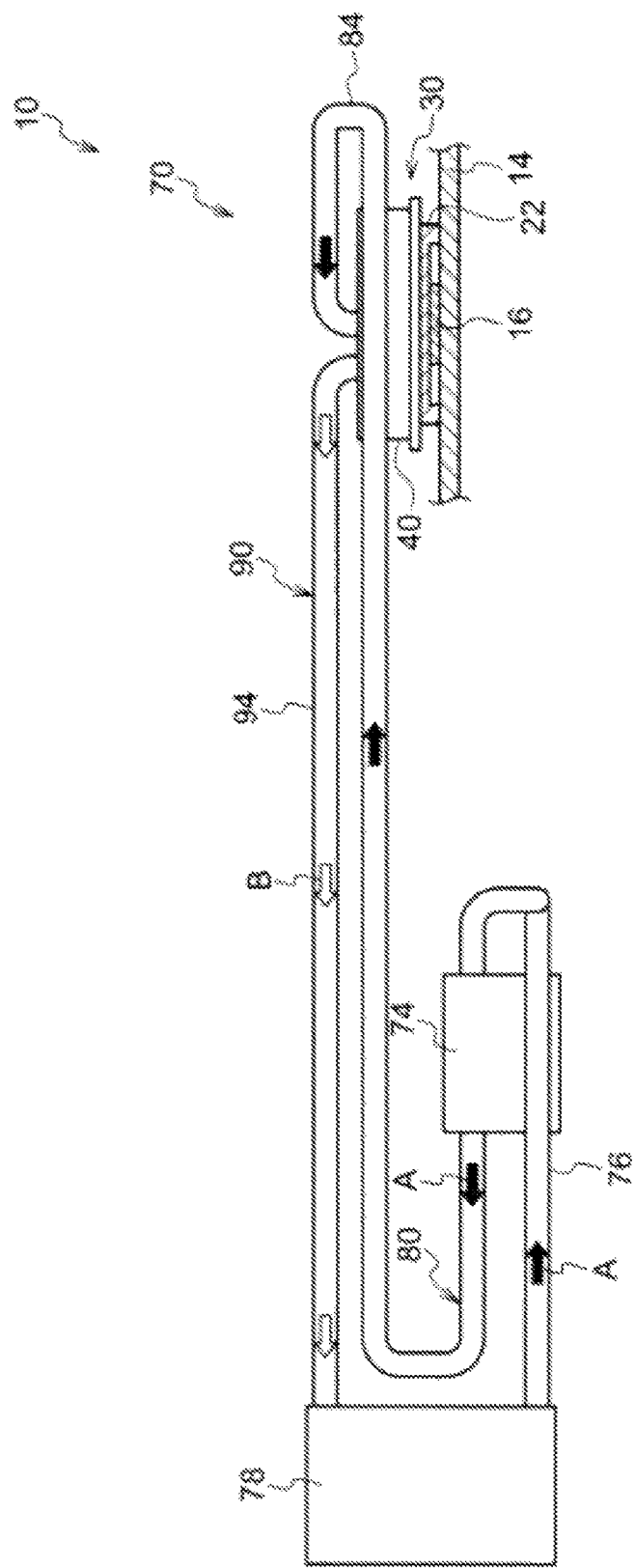
FIG. 1 is a side view of an electronic device.
Figure 2:
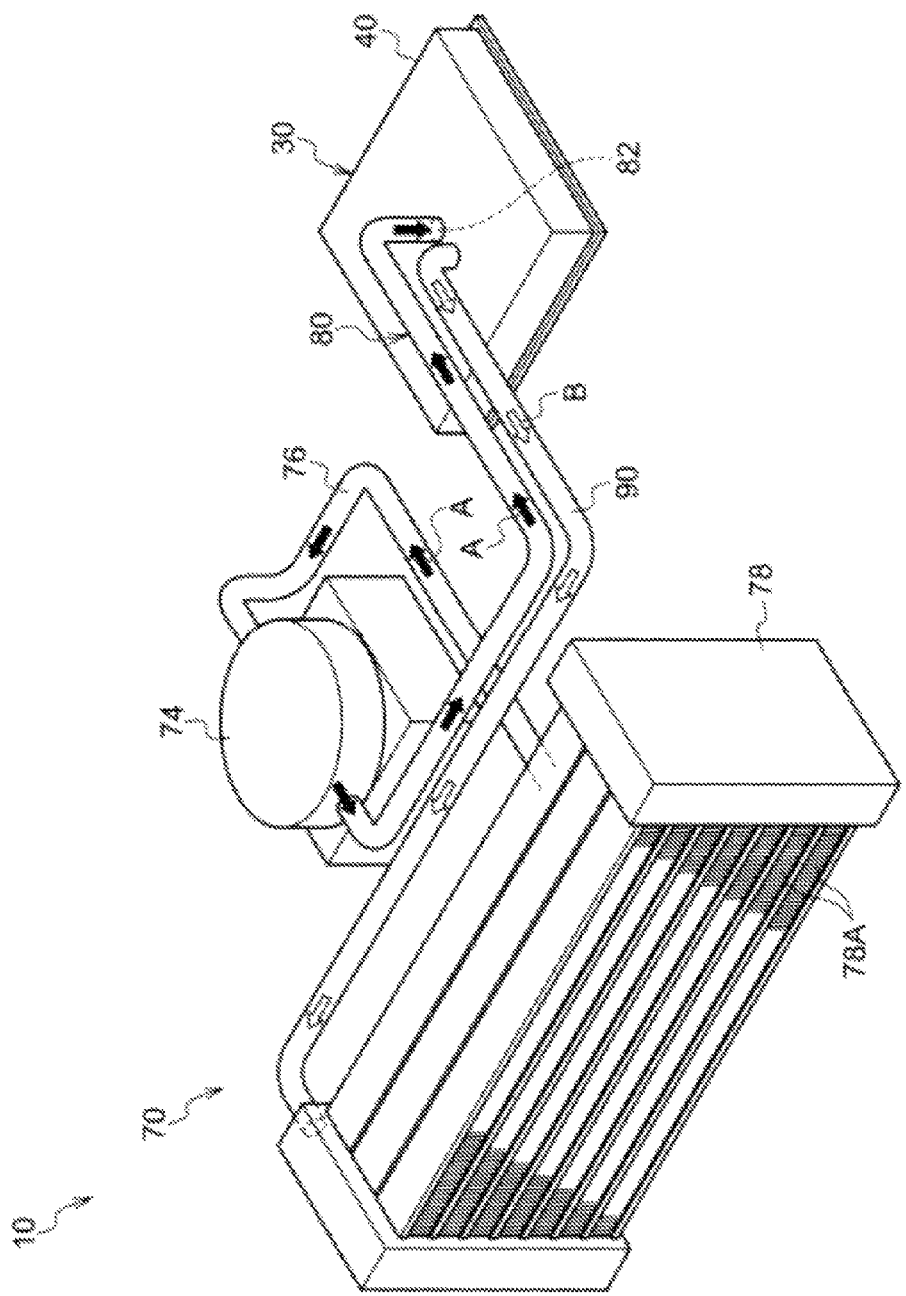
FIG. 2 is a perspective view of the electronic device.
Figure 3:
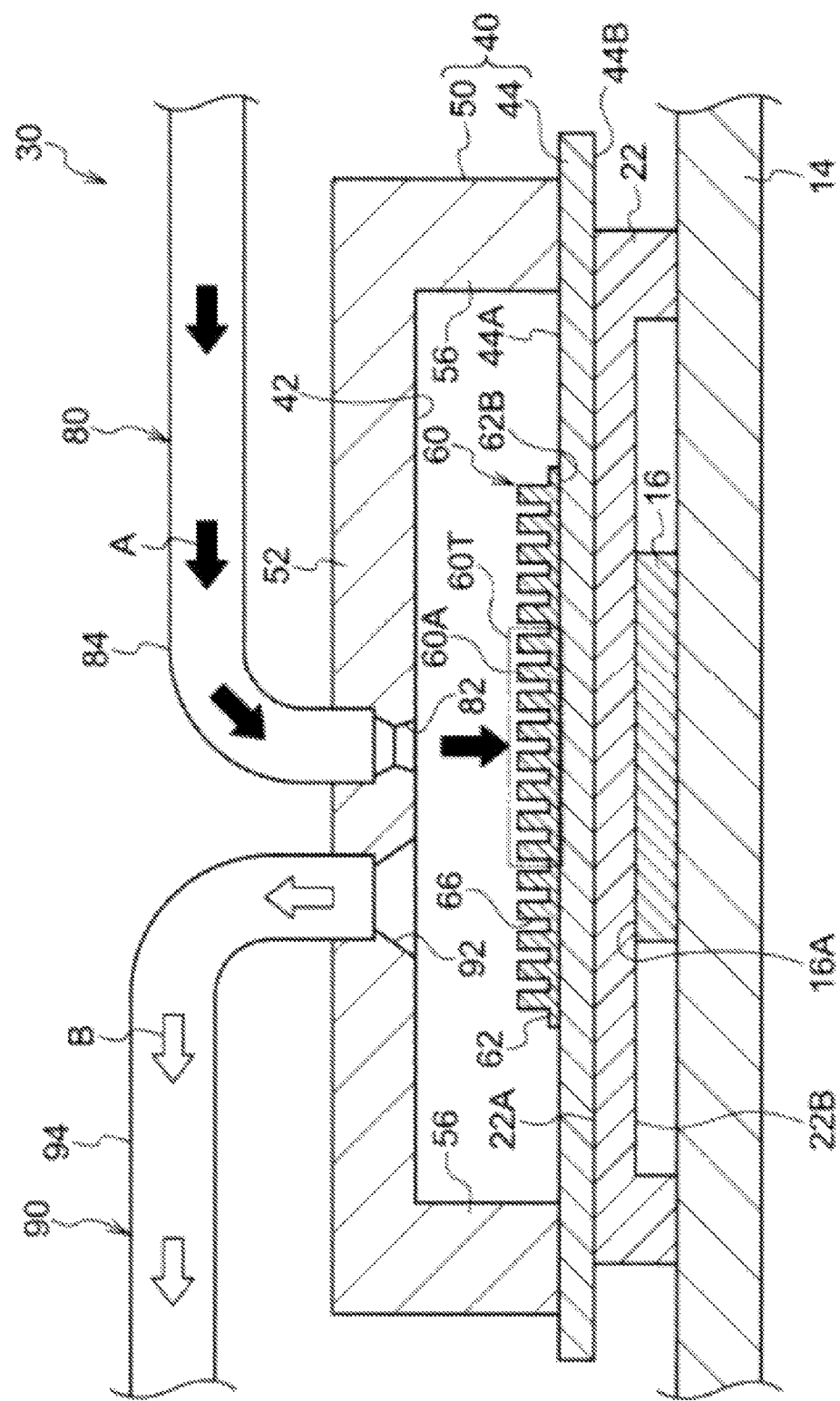
FIG. 3 is a sectional side view of an evaporator.

An electronic device 10 is described. FIG. 1 is a side view of the electronic device 10. FIG. 2 is a perspective view of the electronic device 10. FIG. 3 is a sectional side view of an evaporator that the electronic device 10 is provided with.

As illustrated in FIG. 1 and FIG. 3, the electronic device includes a system board 14 as a base plate. An electronic component 16 (one example of a heating element) is provided on the system board 14. The electronic component 16 is a component to be cooled. The electronic component 16 includes a microprocessor such as a CPU (Central Processing Unit). The electronic component 16 is shaped like a cuboid (plate), by way of example. Note that a component to be cooled is not limited to the electronic component 16 and may be a heating element which generates heat.

In a case where a microprocessor is used as the electronic component 16, a part where a core is placed has a large amount of heat generation and is hot. Therefore, when a microprocessor in which a core is placed at a center area in a planar view is used, the electronic component 16 has a larger amount of heat generation and is hotter in a center area than in a periphery in a planar view. Note that the center area in the planar view refers to a position in the center in a front-back direction and the center in a right-left direction. In this embodiment, an example in which the electronic component 16 is hot at the center in a planar view is described.

In addition, as illustrated in FIG. 3, a spreader 22 configured to spread heat of the electronic component 16 is provided on the system board 14. The spreader 22 is shaped like a cuboid box the system board 14 side (lower side) of which is open. A material with excellent heat conductance is used for the spreader 22. More specifically, metal such as aluminum, copper or the like, for example, is used for the spreader 22.

A top surface 16A of the electronic component 16 and an inner surface 22B of the spreader 22 are bonded by a bond, for example. A metal material such as an alloy, a grease, an elastomer, for example, is used as a bond.

In addition, as illustrated in FIG. 1 and FIG. 2, the electronic device 10 includes a cooling device 70 configured to cool the electronic component 16. The cooling device 70 has an evaporator 30, a pump 74, and a condenser 78.

The pump 74 communicates with the condenser 78 via a communication path 76. The pump 74 communicates with a housing 40 of the evaporator 30 via a supply path 80 to be described below. Under action of pressure, a refrigerant is fed from the condenser 78 to the pump through the communication path 76. In addition, the refrigerant is fed from the pump 74 to the housing 40 of the evaporator 30 through the supply path 80.

As a refrigerant, by way of example, a refrigerant whose main component is water is used. More specifically, a refrigerant in which water is contained most is used. Note that a refrigerant is not limited to a refrigerant for which water is used. For example, alcohol, fluorocarbon, or the like may be used as a refrigerant.

In addition, a refrigerant is defoamed in advance and then sealed in the cooling device 70. Since this puts an interior of the cooling device 70 in a reduced pressure state, boiling in a low temperature zone (50° C. or lower, for example) is possible.

Furthermore, as illustrated in FIG. 1, the pump 74 is placed at a position lower than the housing 40 of the evaporator 30. With this, backflow of steam from the housing 40 of the evaporator 30 to the pump 74 is suppressed. Note that a plurality of pumps 74 may be connected and placed.

In the evaporator 30, the refrigerant is boiled at the housing 40 by heat from the electronic component 16 to generate steam. The steam of the refrigerant generated in the housing 40 of the evaporator 30 is fed to the condenser 78 through a discharge path 90 to be described below. Note that a specific configuration of the evaporator 30 is described below.

The condenser 78 cools the refrigerant steam to liquefy the steam. More specifically, the condenser 78 converts the steam from the evaporator 30 back into liquid. The condenser 78 exchanges heat with ambient air by using radiating fins 78A as illustrated in FIG. 2.

(Evaporator 30)

An evaporator 30 is described.

As illustrated in FIG. 3, the evaporator 30 has a housing (container) 40, a supply path 80 configured to supply a refrigerant into the housing 40, and a discharge path 90 configured to discharge the refrigerant in the housing 40 from the housing 40. The housing 40 has a plate body 44 shaped like a plate and a box body 50 shaped like a box whose plate body 44 side (lower side) is open.

The box body 50 has a top wall 52 (top board) and a peripheral wall 56. The top wall 52 is shaped like a square plate. This top wall 52 forms a wall opposed to the plate body 44. Inside the housing 40 is formed an evaporation chamber 42 configured to evaporate the refrigerant. No partition is provided in the evaporation chamber 42. More specifically, the evaporation chamber 42 is formed of a single space without any partition.

The peripheral wall 56 is provided integrally with the top wall 52 along an edge of each side of the top wall 52. More specifically, in a planar view, the peripheral wall 56 is shaped like a frame along the outer peripheral edge of the top wall 52. Lower ends of the peripheral wall 56 are connected to outer peripheral parts of the plate body 44.

More specifically, the plate body is a flat plate. An under surface 44B (outer wall surface) of the plate body 44 is bonded with a top surface 22A (outer surface) of the spreader 22 by a bond, for example. With this, heat from the electronic component 16 is transmitted to the plate body 44 via the spreader 22. Note that a metal material such as an alloy, a grease, an elastomer is used as a bond.

Figure 4:
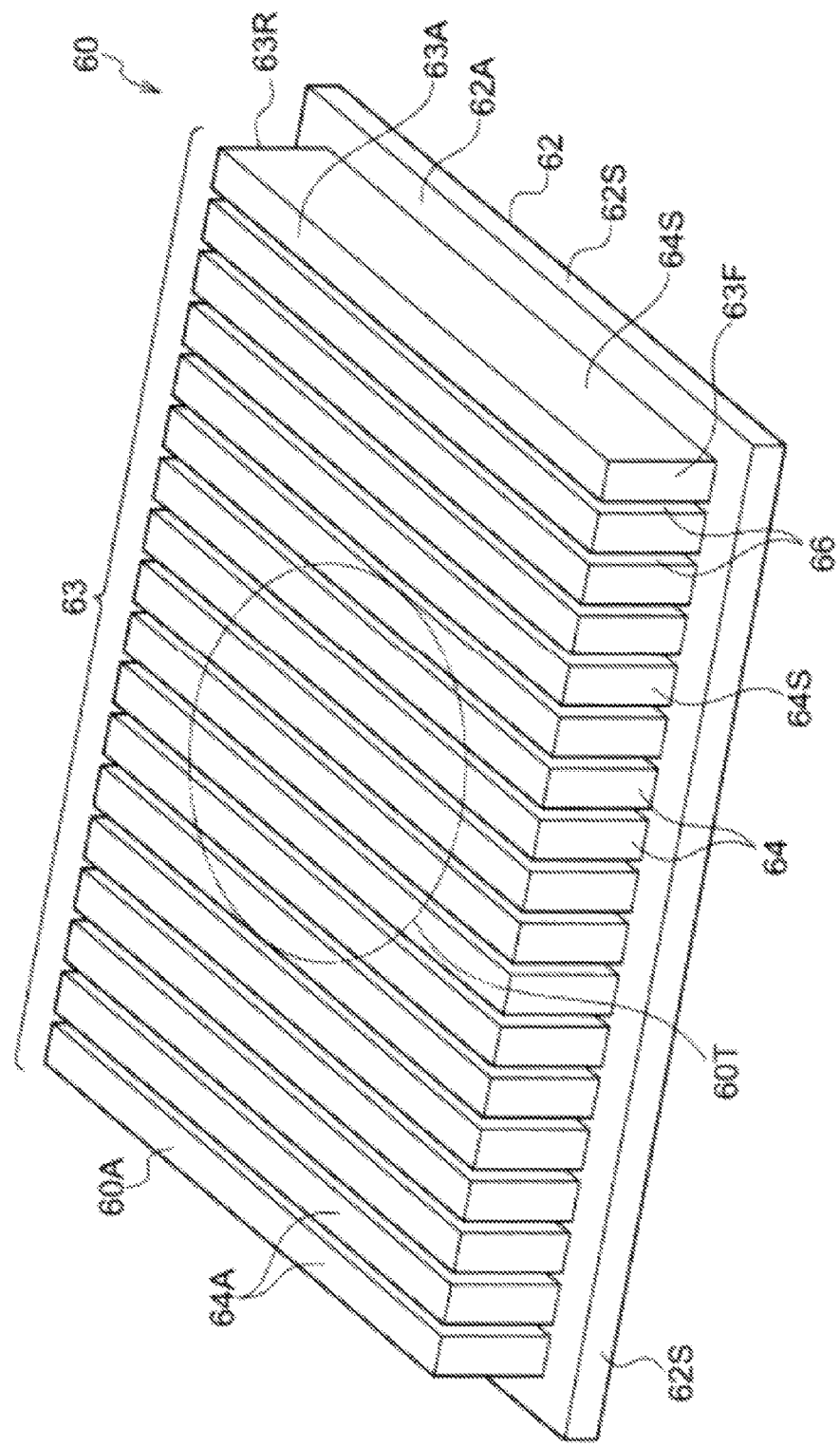
FIG. 4 is a perspective view of a heat transfer unit.

A heat transfer unit 60 configured to transfer heat from the electronic component 16 to a refrigerant is provided on a top surface 44A (inner wall surface) of the plate body 44. As illustrated in FIG. 4, the heat transfer unit 60 has a plate section 62 and a cuboid-shaped block section 63 having a plurality of narrow grooves 66 (slits).

The plurality of narrow grooves 66 are arranged along the right-left direction on the block section 63. Each of the narrow grooves 66 is formed along the front-back direction on a top surface 63A of the block section 63 of the block section 63. Specifically, each narrow groove 66 reaches the top surface 63A of the block section 63. Specifically, each narrow groove 66 reaches the back surface 63R from the front surface 63F of the block section 63. In addition, each narrow groove 66 reaches a top surface 62A of the plate section 62 from the top surface 63A of the block section 63. The narrow grooves 66 divide the block section 63 into a plurality of parts. The block section 63 thus being divided into the plurality of parts, a contact area of the heat transfer unit 60 with the refrigerant increases. The divided parts of the block section 63 form projections 64 which project upward from the plate section 62.

In a front view, the projection 64 is shaped like a rectangle oblong which is made longer in the vertical direction than in the right-left direction. On one hand, in a side view, the projection 64 is shaped like a rectangle oblong which is made longer in the right-left direction than in the vertical direction.

Figure 5:
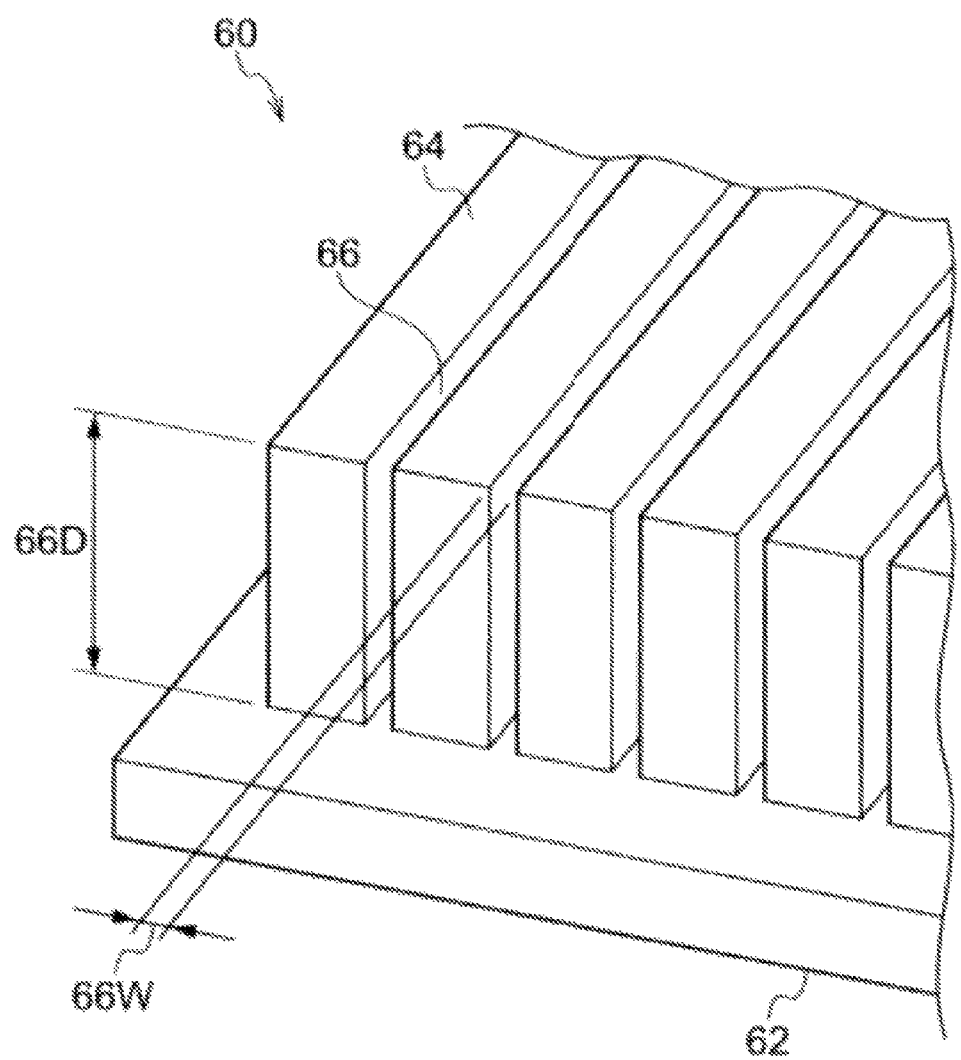
FIG. 5 is a partially enlarged perspective view of the heat transfer unit.

Furthermore, groove depth 66D (see FIG. 5) of the narrow groove 66 (gap) between the projections 64 is set to 3 mm, for example. Groove width 66W (see FIG. 5) along the right-left direction of the narrow groove 66 is set to 0.2 mm or more to 0.6 mm or less, for example.

In addition, dimensions of the groove depth 66D of 3 mm and the groove width 66W of 0.2 mm or more to 0.6 mm or less are design values and may differ from actual dimensions within allowable tolerances. Therefore, if the tolerance of the groove depth 66D is ±0.1 mm, for example, the actual dimensions of the groove depth 66D may be in the range of 2.9 mm to 3.1 mm.

In the heat transfer unit 60, surfaces of the plate section 62 excluding a bottom surface 62B are in contact with the refrigerant in the housing 40. More specifically, the surfaces excluding the bottom surface 62B of the plate section 62 form inner walls of the housing 40. The surfaces excluding the bottom surface 62B of the plate section 62 are, specifically, the top surface 62A of the plate section 62, four side surfaces 62S of the plate section 62, the top surfaces 64A of the respective projections 64 (the top surface 63A of the block section 63), and four side surfaces 64S of the respective projections 64.

For example, a material with excellent heat conductance is used for the heat transfer unit 60. Specifically, metal such as aluminum, copper, stainless steel, for example, is used for the heat transfer unit 60. The heat transfer unit 60 is formed by injection molding, forging, or cutting, for example.

As illustrated in FIG. 3, in the heat transfer unit 60, the bottom surface 62B of the plate section 62 is bonded to the top surface 44A of the plate body 44 of the housing 40 by a bond, for example. A metal material such as an alloy, a grease, an elastomer is used as a bond. With this, heat from the electronic component 16 is transferred to the heat transfer unit 60 via the spreader 22 and the plate body 44.

In the embodiment, since the electronic component 16 is hot at the center area in the planar view, the top surface 60A of the heat transfer unit 60 (top surface 63A of the block section 63) is also hotter at the center area than at the periphery in the planar view. More specifically, the center area in the planar view on the top surface 60A of the heat transfer unit 60 (one example of a heat transfer surface) is a hot area 60T (see FIG. 4). Note that any area other than the center area may also be the hot area 60T.

Figure 6:
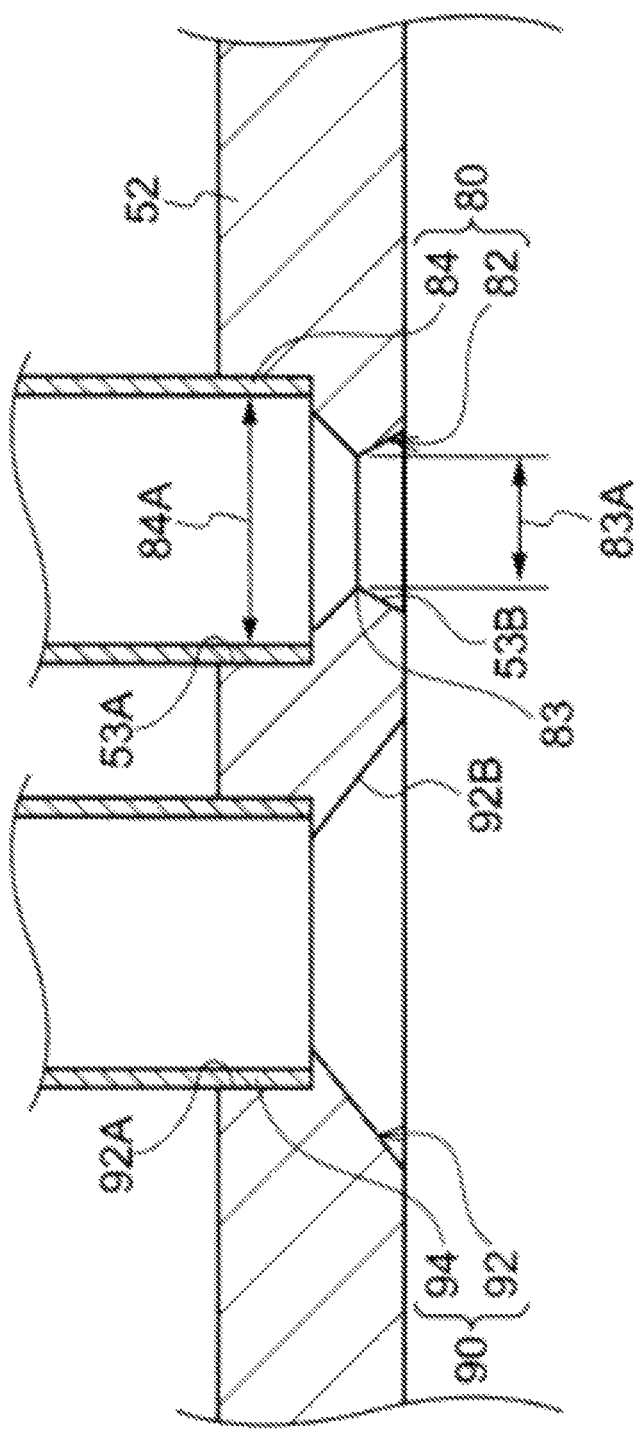
FIG. 6 is an enlarged sectional side view of a tip of a supply path and a tip of a discharge path.

As illustrated in FIG. 6, specifically, the supply path 80 has a supply hole 82 formed on the top wall 52 and a liquid pipe 84 (one example of a supply pipe) through which the refrigerant flows toward the supply hole 82. Specifically, the supply hole 82 is formed at the center area in the planar view of the top wall 52 (see FIG. 2). More specifically, the supply hole 82 is arranged in the center in the front-back direction and the center in the right-left direction. This causes the supply hole to be opposed to the hot area 60T of the heat transfer unit 60. More specifically, the supply hole 82 is arranged right above the hot area 60T of the heat transfer unit 60. Therefore, the supply hole 82 opens to the center area of the electronic component 16 in the planar view. The supply hole 82 also opens to a direction (downward) perpendicular to the top surface 60A of the heat transfer unit 60.

The supply hole 82 has an insertion unit 53A into which a tip of the liquid pipe 84 is inserted and a supply port 53B where a choke 83 is formed. The insertion unit 53A is placed in the upper part of the top wall 52. The insertion unit 53A is made a circular hole having an inner wall along the outer circumference of the liquid pipe 84.

The supply port 53B is placed in the lower part of the top wall 52. An upper end of the supply port 53B has a smaller diameter than the insertion unit 53A. The diameter is gradually contracted downward from the upper end and becomes smallest at an intermediate part in the vertical direction (axial direction). Then, the diameter gradually expands downward from the smallest diameter part (choke 83). Thus, the choke 83 is formed at the tip (lower part) of the supply hole 82.

Then, the liquid pipe 84 being inserted into the insertion unit 53A of the supply hole 82, the liquid pipe 84 is connected to the supply hole 82. An upstream end of the liquid pipe 84 communicates with the pump 74. The pump 74 supplies the refrigerant in a liquid state to the evaporation chamber 42 through the liquid pipe 84 and the supply port 53B. Thus, since with forced convection by driving force of the pump 74, the refrigerant is supplied into the evaporation chamber 42 through the supply port 53B having the choke 83, the refrigerant is ejected into the evaporation chamber 42. In addition, as described above, opposed to the hot area 60T of the heat transfer unit 60, the supply port 53B supplies the refrigerant into the evaporation chamber 42 while causing the refrigerant to collide against the hot area 60T.

In addition, a state in which pressing force of the refrigerant ejected from the supply port 53B acts on the surface of the hot area 60T is a state in which the refrigerant collides against the hot area 60T.

The choke 83 of the supply port 53B has an inside diameter ratio to the liquid pipe 84 (non-choked part) set to 40% or more to 90% or less. More specifically, an inside diameter 83A of the choke 83 is set to dimensions in the range of 40% or more to 90% or less of an inside diameter 84A of the liquid pipe 84.

The discharge path 90 has specifically a discharge hole 92 and a steam pipe 94 connected to the discharge hole 92 formed on the top wall 52.

As illustrated in FIG. 3, specifically, the discharge hole 92 is formed in the top wall 52 on a periphery side (left side in FIG. 3) of the supply hole 82. Specifically, the discharge hole 92 is placed at a position which is opposed to the top surface 60A of the heat transfer unit 60 and is on the left side of the center in the front-back direction.

Note that in the embodiment, the supply hole 82 has only to be placed at a position closer to the center in a planar view of the top wall 52 than the discharge hole 92.

As illustrated in FIG. 6, the discharge hole 92 has an insertion section 92A into which a tip of the steam pipe 94 is inserted and a taper section 92B. The insertion section 92A is placed in the upper part of the top wall 52. The insertion section 92A is a circular hole having an inner wall along the outer circumference of the steam pipe 94.

The taper section 92B is placed in the lower part of the top wall 52. The taper section 92B is formed like a taper whose diameter is gradually contracted upward from a lower end. An upper end of the taper section 92B has the smallest diameter and is made smaller than the insertion section 92A.

Then, the steam pipe 94 is inserted into the insertion section 92A of the discharge hole 92, and is connected with the discharge hole 92. A downstream end of the steam pipe 94 communicates with the condenser 78. With this, steam of the refrigerant generated in the housing 40 of the evaporator 30 is fed to the condenser 78 through the discharge hole 92 and the steam pipe 94.

(Mode of the Embodiment)

A mode of the embodiment is described.

In the embodiment, when the pump 74 is driven, as depicted by arrows A in FIG. 1, a refrigerant in a liquid state is fed from the condenser 78 to the pump 74v through the communication path 76. Furthermore, the refrigerant in the liquid state is fed from the pump 74 to the housing 40 of the evaporator 30 through the supply path 80.

As illustrated in FIG. 3, the refrigerant fed to the housing 40 of the evaporator 30 is ejected to spread over the hot area 60T of the heat transfer unit 60 from the supply hole 82 (supply port 53B), being supplied into the evaporation chamber 42 while colliding against the hot area 60T.

Brought to a boil by heat of the heat transfer unit 60 including the hot area 60T, the refrigerant is converted into steam which is then discharged from the housing 40 through the discharge hole 92. In addition, the refrigerant being boiled by heat from the heat transfer unit 60, a steam bubble is generated in the narrow grooves 66. The steam bubble in the narrow grooves 66 is discharged from the narrow grooves 66 and the refrigerant steam is discharged from the housing 40 through the discharge hole 92. As depicted by arrow B in FIG. 1, the refrigerant discharged from the housing 40 is fed to the condenser 78 through the steam pipe 94, and the steam is cooled by the condenser 78 to be converted back to liquid.

Here, in the embodiment, as described above, a refrigerant is ejected to spread over the hot area 60T of the heat transfer unit 60, causing the refrigerant to collide against the hot area 60T. More specifically, in the embodiment, a refrigerant is caused to directly collide against the hot area 60T as colliding jet, which thereby promotes boiling and heat transfer by forced convection. With this, subcool boiling (phenomenon that liquid boils at a lower temperature than a saturated temperature of the liquid) occurs effectively in the hot area 60T. Thus, in comparison with a case where liquid reaches the saturated temperature and then boils, the heat transfer performance of transferring heat of the hot area 60T to a refrigerant is improved. This promotes absorption of heat from the electronic component 16 and the cooling performance of cooling the electronic component 16 is improved. Note that the saturated temperature is a temperature at which liquid bois under predetermined pressure. For example, the saturated temperature of water at standard atmospheric pressure is 100° C.

In addition, direct application of a refrigerant to the hot area 60T as colliding jet has the effect of scraping off (discharging) steam bubbles generated in the narrow grooves 66 of the hot area 60T from the narrow grooves 66. This promotes the absorption of heat from the electronic component 16 and the cooling performance of cooling the electronic component 16 is improved.

In addition, in the embodiment, the choke 83 is formed at the tip of the supply hole 82. In the embodiment, in particular, the choke 83 has the inside diameter ratio to the liquid pipe 84 set to equal to or less than 90%. In addition, the inside diameter of the liquid pipe 84 is from 3 mm to 4 mm, for example.

This increases flow velocity of a refrigerant when the refrigerant is ejected into the housing 40 and may improve the effect of the subcool boiling and the effect of scraping off steam bubbles from the narrow grooves 66. Thus, the absorption of heat from the electronic component 16 is promoted and the cooling performance of cooling the electronic component 16 is improved.

Furthermore, in the embodiment, the flow velocity of the refrigerant to be ejected to the hot area 60T increases by setting the inside diameter ratio of the choke 83 to the liquid pipe 84 equal to or more than 40%. Thus, in comparison with a case where the inside diameter ratio is less than 40%, the heat transfer performance of transferring heat of the hot area 60T to the refrigerant is improved. This promotes the absorption of heat from the electronic component 16 and the cooling performance of cooling the electronic component 16 is improved.

In addition, in the embodiment, the groove width 66W (see FIG. 5) of the narrow groove 66 of the heat transfer unit 60 is set to 0.2 mm or more to 0.6 mm or less, for example. In addition, the groove depth 66D (see FIG. 5) of the narrow groove 66 is set to 3 mm, for example.

Here, efficient discharging from the narrow grooves 66 of steam bubbles generated in the narrow grooves 66 improves the heat transfer performance, and thus the cooling performance. Then, it is found that the groove width 66W and the groove depth 66D of the narrow grooves 66 have effect on discharging of steam bubbles from the narrow grooves 66. Thus, in the embodiment, the groove width 66W of the narrow grooves 66 of the heat transfer unit 60 is set to 0.2 mm or more to 0.6 mm or less, for example. In addition, the groove depth 66D of the narrow grooves 66 is set to 3 mm, for example.

Figure 7:
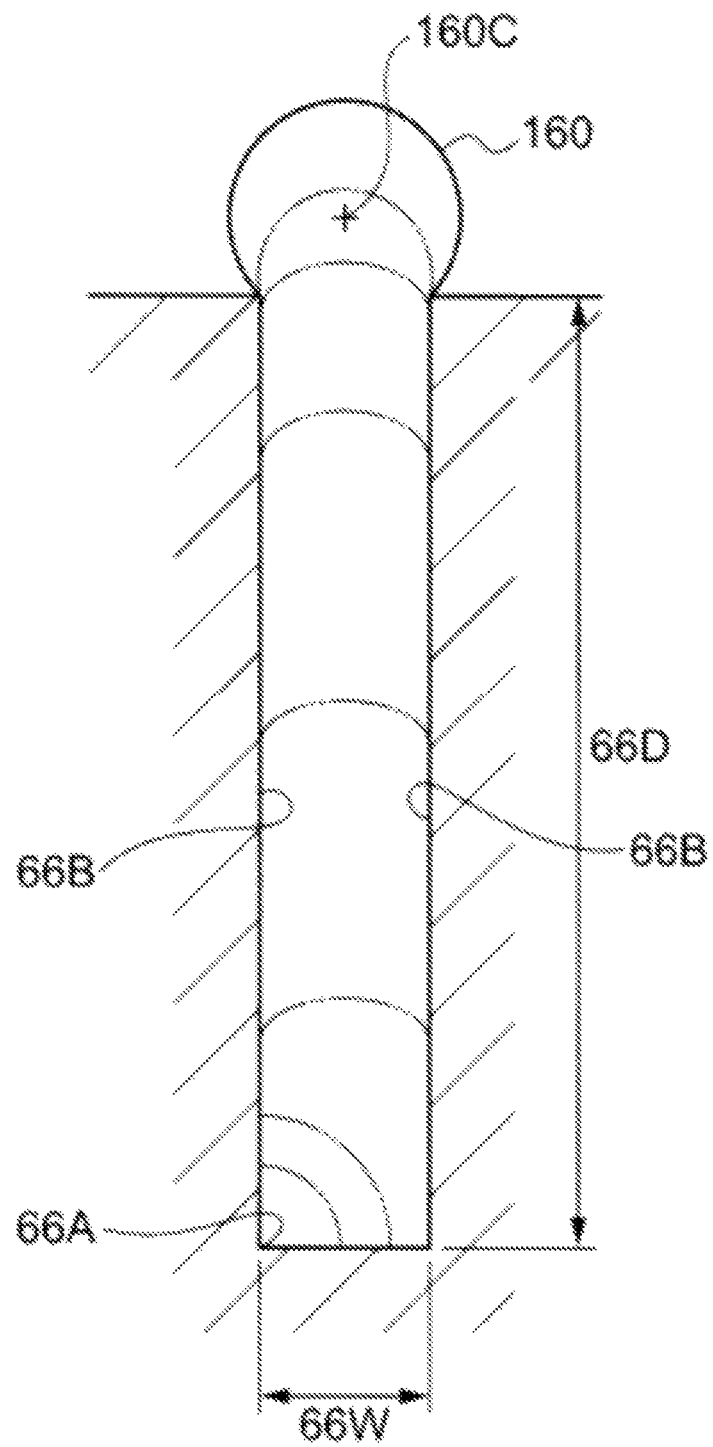
FIG. 7 is a view illustrating a growth process of a steam bubble in a narrow groove of the heat transfer unit.

As illustrated in FIG. 7, specifically, a steam bubble 160 is firstly generated at a corner 66A on the bottom of the narrow groove 66. The steam bubble 160 gradually grows to be a bubble having a radius of curvature corresponding to the groove width 66W. In addition, continuously generated at the corner 66A of the narrow groove 66, the steam bubble 160 moves toward the upper end (opening) of the narrow groove 66 while being in contact with opposed side walls 66B in the narrow groove 66. Then, the steam bubble 160 begins to expand from the upper end of the narrow groove 66 to the upper side. The steam bubble expands to the outside of the narrow groove 66 with the curvature center 160C of the steam bubble 160 located outside the narrow groove 66. As such, scrapped off by the refrigerant colliding against the top surface 60A of the heat transfer unit 60, the steam bubble 160 that expands to the outside of the narrow groove 66 is discharged from the narrow groove 66. Note that the growth process of the steam bubble 160 is illustrated by a two-dot chain line in FIG. 7.

When the groove width 66W is less than 0.2 mm, the steam bubble with a small radius of curvature is generated. Thus, a contact area with the side walls 66B in the narrow grooves 66 is relatively large. It is considered that this increases adhesion force of the steam bubble 160 to the side walls 66B in the narrow groove 66. It is also considered that the strong adhesion force to the side walls 66B reduces height of the steam bubble 160 expanding out from the upper end of the narrow groove 66 to the upper side. It is therefore considered that even if the steam bubble 160 expands to the outside of the narrow groove 66, the curvature center 160C of the steam bubble 160 is still located within the narrow groove 66. Thus, the steam bubble 160 is not easily scraped off, which delays discharging from the narrow groove 66.

When the groove width 66W exceeds 0.6 mm, the radius of curvature of the steam bubble 160 generated in the narrow groove 66 is too large. Thus, it is considered that the steam bubble 160 collapses, which makes smaller the height of the steam bubble 160 expanding out from the upper end of the narrow groove 66 to the upper side. It is therefore considered that even if the steam bubble 160 expands to the outside of the narrow groove 66, the curvature center 160C of the steam bubble 160 is still located within the narrow groove 66. Thus, the steam bubble 160 is not easily scraped off, which delays discharging from the narrow groove 66.

In contrast to this, in the embodiment, since the groove width 66W is set to 0.2 mm or more to 0.6 mm or less, the steam bubble 160 may grow to size that has a radius of curvature which facilitates scraping, and be discharged from the narrow grooves 66 continuously. This improves the heat transfer performance of transferring heat of the hot area 60T to the refrigerant and the electronic component 16 may be cooled effectively.

When the groove depth 66D exceeds 3 mm (when the groove depth 66D is 4 mm, for example), it takes time for the steam bubble 160 to reach the upper end of the narrow groove 66. Thus, discharging of the steam bubble 160 from the narrow groove 66 is delayed.

When the groove depth 66D is less than 3 mm (when the groove depth 66D is 2 mm, for example), there is not sufficient height (space) for the steam bubble 160 to grow. It is thus considered that the growth of the steam bubble 160 is delayed. Accordingly, cycle of generation and discharging of the steam bubble 160 slows.

In the embodiment, since the groove depth 66D is set to 3 mm, the cycle of generation and discharging of the steam bubble 160 is not delayed, and the steam bubble 160 may be discharged continuously from the narrow groove 66. This improves the heat transfer performance of transferring heat of the hot area 60T to the refrigerant and the electronic component 16 may be cooled effectively.

(Evaluation 1)

Figure 8:
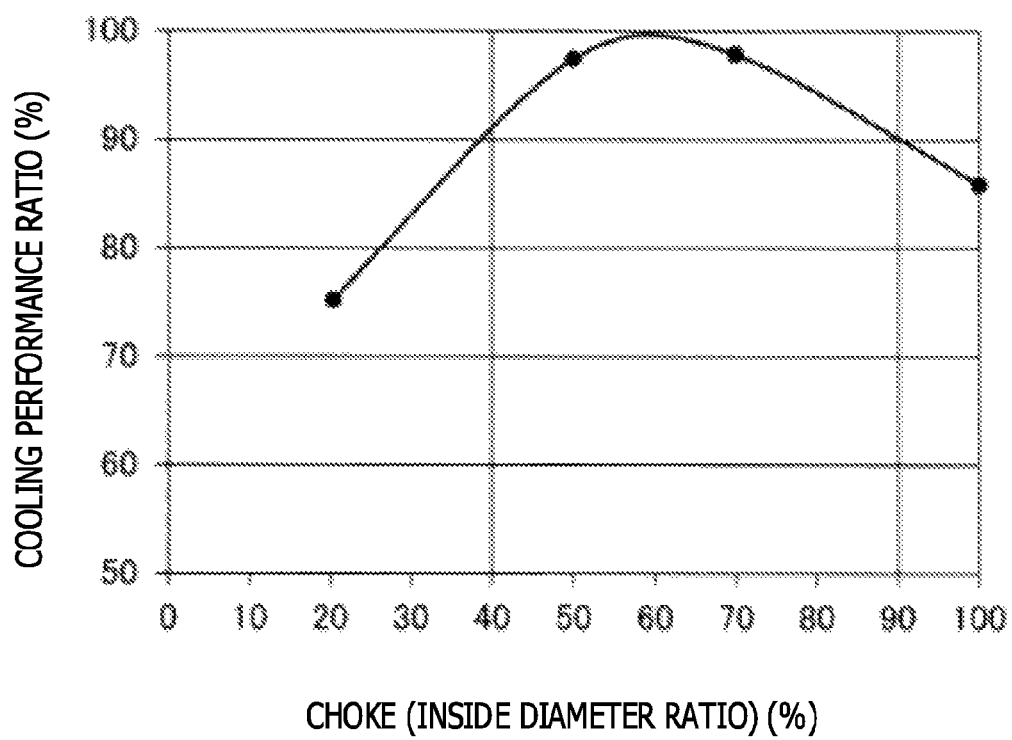
FIG. 8 is a graph depicting a relation of an inside diameter ratio of a choke to a liquid pipe and a cooling performance ratio in a supply path.

Evaluation 1 evaluated a cooling performance ratio (%) of the above-described cooling device 70 when the inside diameter ratio (%) of the choke 83 to the liquid pipe 84 was changed. FIG. 8 is a graph depicting a result of the evaluation.

The cooling performance is specifically calculated with heat flux (quantity of heat transferred through a unit area in unit time), heat resistance and the like. The cooling performance ratio is calculated with "cooling performance at a given inside diameter ratio÷maximum cooling performance×100". The maximum cooling performance is a value of the highest cooling performance in the inside diameter ratios evaluated.

As depicted in FIG. 8, as a result of the evaluation, when the inside diameter ratio of the choke 83 to the liquid pipe 84 is set to 40% or more to 90% or less, the cooling performance increases by approximately 5 to 15%, and the cooling performance ratio is 90% or more, in comparison with a case with no choke 30.

(Evaluation 2)

Figure 9:
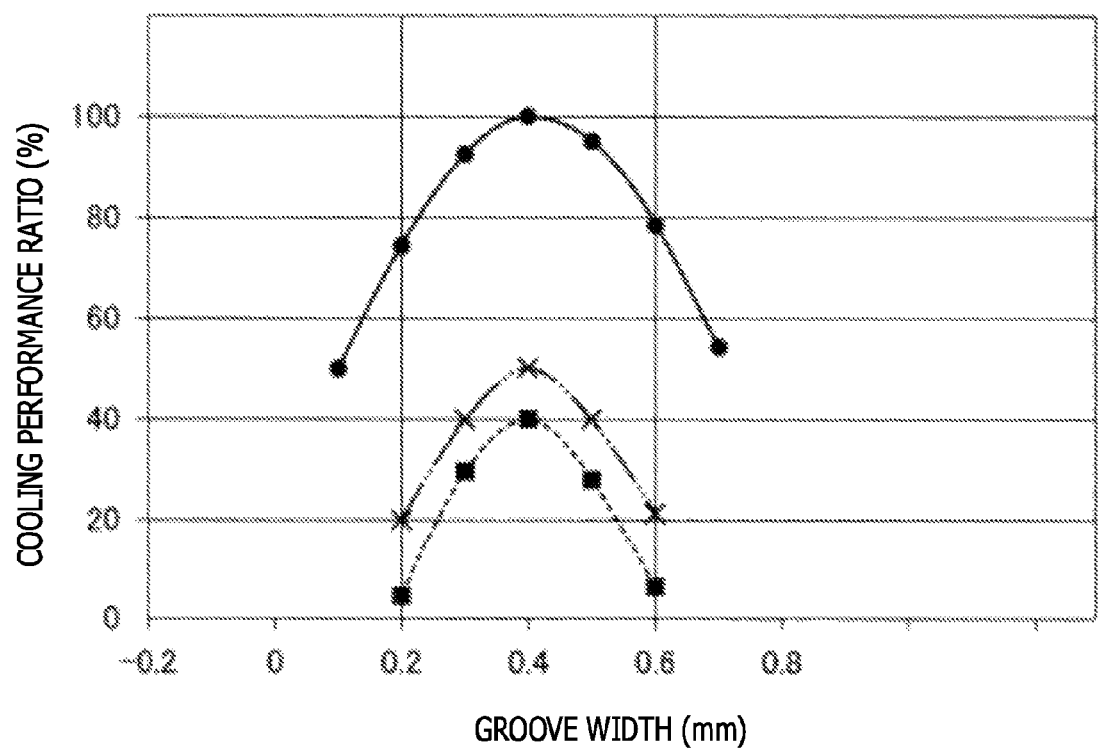
FIG. 9 is a graph depicting a relation of width of a narrow groove and the cooling performance ratio.

Evaluation 2 evaluated the cooling performance ratio (%) of the above-described cooling device 70 when the groove width 66W was changed in the case where the groove depth 66D was set to 2 mm, 3 mm, and 4 mm, respectively. FIG. 9 is a graph depicting a result of the evaluation.

When the groove depth 66D was 3 mm, the groove width 66W was changed in the range of 0.1 mm to 0.7 mm. When the groove depth 66D was 2 mm and 4 mm, the groove depth 66W was changed in the range of 0.2 mm to 0.6 mm.

The cooling performance is specifically calculated with heat flux (quantity of heat transferred through a unit area in unit time), heat resistance and the like. The cooling performance ratio is calculated with "cooling performance at given groove depth÷maximum cooling performance×100". The maximum cooling performance is a value of the highest cooling performance in the groove widths evaluated.

As depicted by the solid line in the graph of FIG. 9, as a result of the evaluation, when the groove depth 66D was set to 3 mm, the cooling performance ratio was equal to or more than 70% if the groove width 66W was in the range of 0.2 mm to 0.6 mm.

On the one hand, when the groove depth 66D was set to 2 mm (see the two-dot chain line in FIG. 9) and when the groove depth 66D was set to 4 mm (see the dashed line in FIG. 9), the cooling performance ratio was equal to or less than 50% even if the groove width was set to the range from 0.2 mm to 0.6 mm.

In this manner, it was learned that it was possible to improve the heat transfer performance and cool the electronic component 16 effectively, by setting the groove depth 66D of the narrow groove 66 to 3 mm and the groove width 66D to 0.2 mm or more to 0.6 mm or less. In addition, the groove depth 66D and the groove width 66W that is capable of effectively cooling the electronic component 16 may be expressed by a ratio of the groove width 66W to the groove depth 66D, which is expressed by (groove width 66W/groove depth 66D*100(%)). The ratio is 7% or more to 20% or less, for example.

(Variation Examples)

Variation examples of the embodiment are described.

Figure 10:
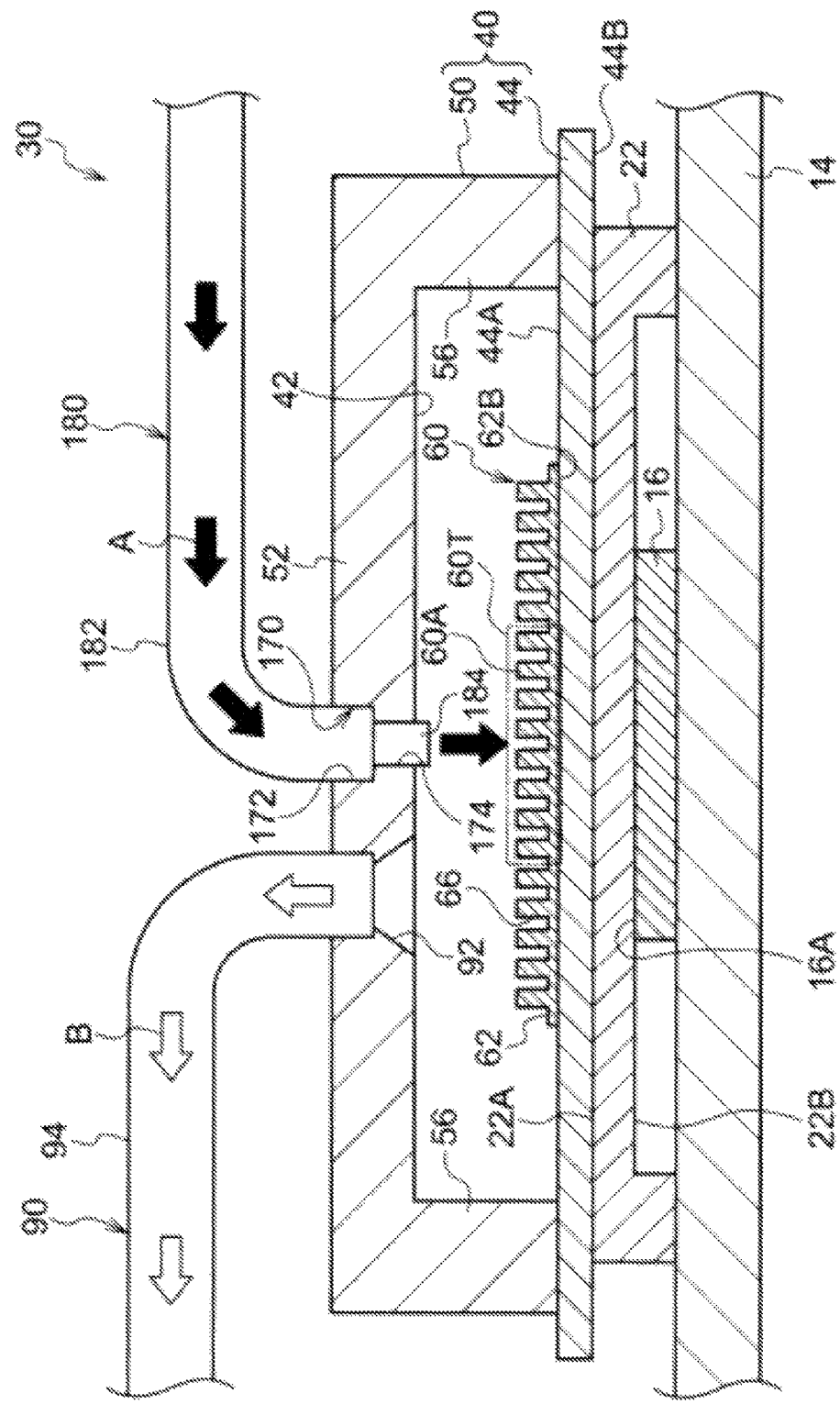
FIG. 10 is a side sectional view illustrating a variation example of a supply path.

A supply path configured to supply a refrigerant to the housing 40 is not limited to the supply path 80 described above and may be a supply path 180 illustrated in FIG. 10.

In the supply path 180, a tip projects into the housing 40. The supply path 180 specifically has a large-diameter pipe 182 and a small-diameter pipe 184 (one example of a port section) having a supply port 183. The large-diameter pipe 182 has a larger diameter than the small-diameter pipe 184. The small-diameter pipe 184 is provided at the tip of the large-diameter pipe 182.

On the one hand, an insertion hole 170 into which the large-diameter pipe 182 and the small-diameter pipe 184 are inserted is provided on the top wall 52 of the housing 40. The insertion hole 170 has a large-diameter part 172 into which the large-diameter pipe 182 is inserted and a small-diameter part 174 into which the small-diameter pipe 184 is inserted. Axial length of the small-diameter part 174 is made shorter than axial length of the small-diameter pipe 184. With this, the small-diameter pipe 184 inserted into the small-diameter part 174 projects downward from the underside of the top wall 52 of the housing 40.

As such, in the supply path 180, since the small-diameter pipe 184 projects downward from the underside of the top wall 52, a distance to the top surface 60A of the heat transfer unit 60 is shorter. Hence, the flow velocity of the refrigerant when colliding against the top surface 60A of the heat transfer unit 60 is higher than a case where the tip of the supply path does not project. This may improve the effect of subcool boiling and the effect of scraping off steam bubbles from the narrow grooves 66. Therefore, the absorption of heat from the electronic component 16 is promoted and the cooling performance of cooling the electronic component 16 is improved.

While one supply path 80 described above is placed at a position opposed to the hot area 60T of the heat transfer unit 60, the supply path 80 is not limited to this. For example, if the heat transfer unit 60 has a plurality of the hot areas 60T as illustrated in FIG. 11, a structure may be such that the same number of supply paths 80 are provided in the same number as the hot areas 60T, and are opposed to the hot areas 60T on a one-to-one basis.

Figure 11:
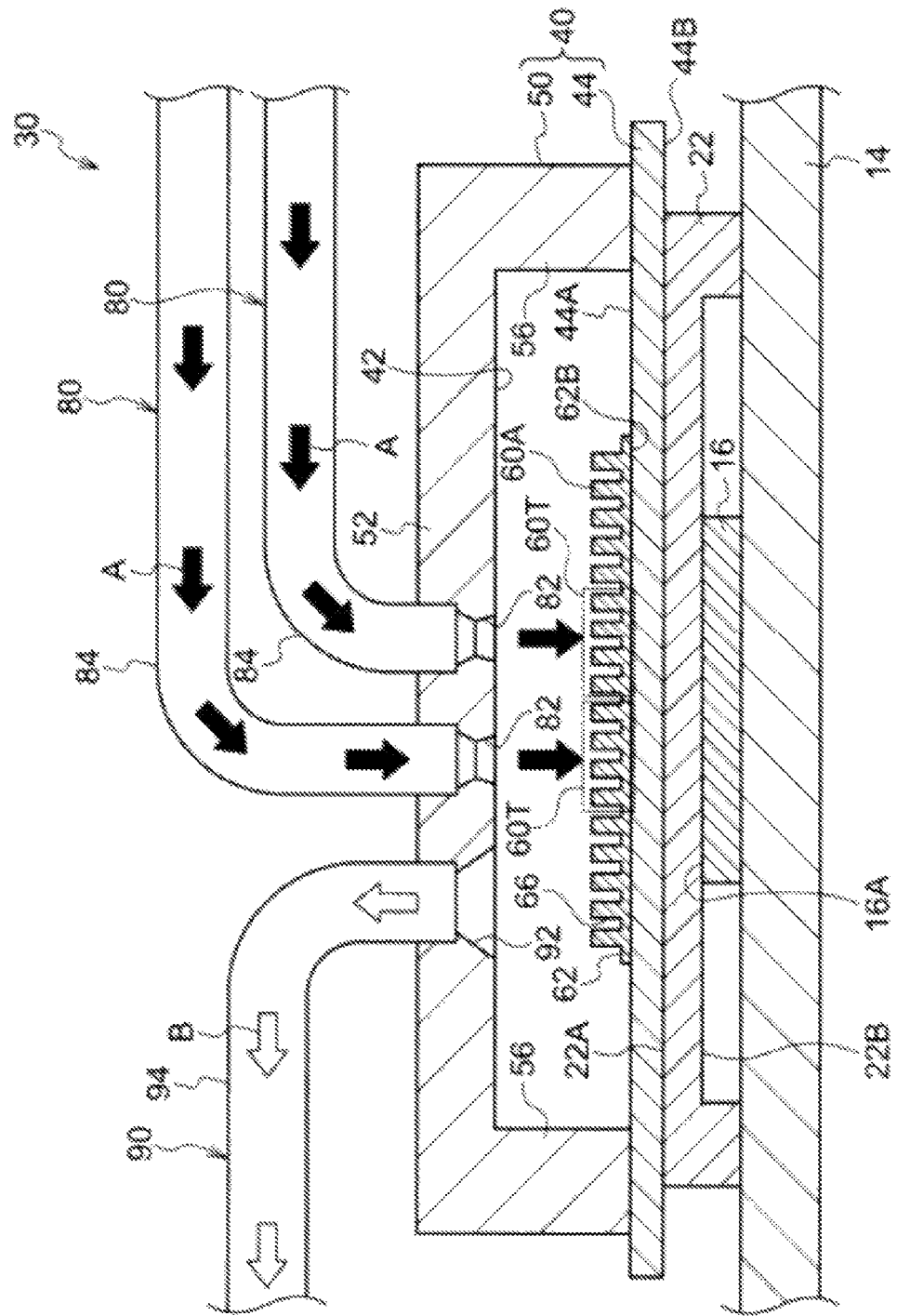
FIG. 11 is a sectional side view illustrating a variation example in which a plurality of supply paths are provided.

In the example as illustrated in FIG. 11, for example, the heat transfer unit 60 has two hot areas 60T, and a supply path 80 (supply hole 82) is placed at a position opposed to each of the hot areas 60T. With this, a refrigerant is ejected from each supply hole 82 to each hot area 60T of the heat transfer unit 60. The refrigerant is supplied into the housing 40, while colliding against each hot area 60T, and facilitates boiling and heat transfer of forced convection. In each hot area 60T, the subcool boiling (phenomenon that liquid boils at a lower temperature than a saturated temperature of the liquid) occurs effectively. Thus, in comparison with a case where liquid reaches the saturated temperature and then boils, the heat transfer performance of transferring heat of the hot area 60T to a refrigerant is improved. With this, the electronic component 16 may be cooled effectively.

Figure 12:
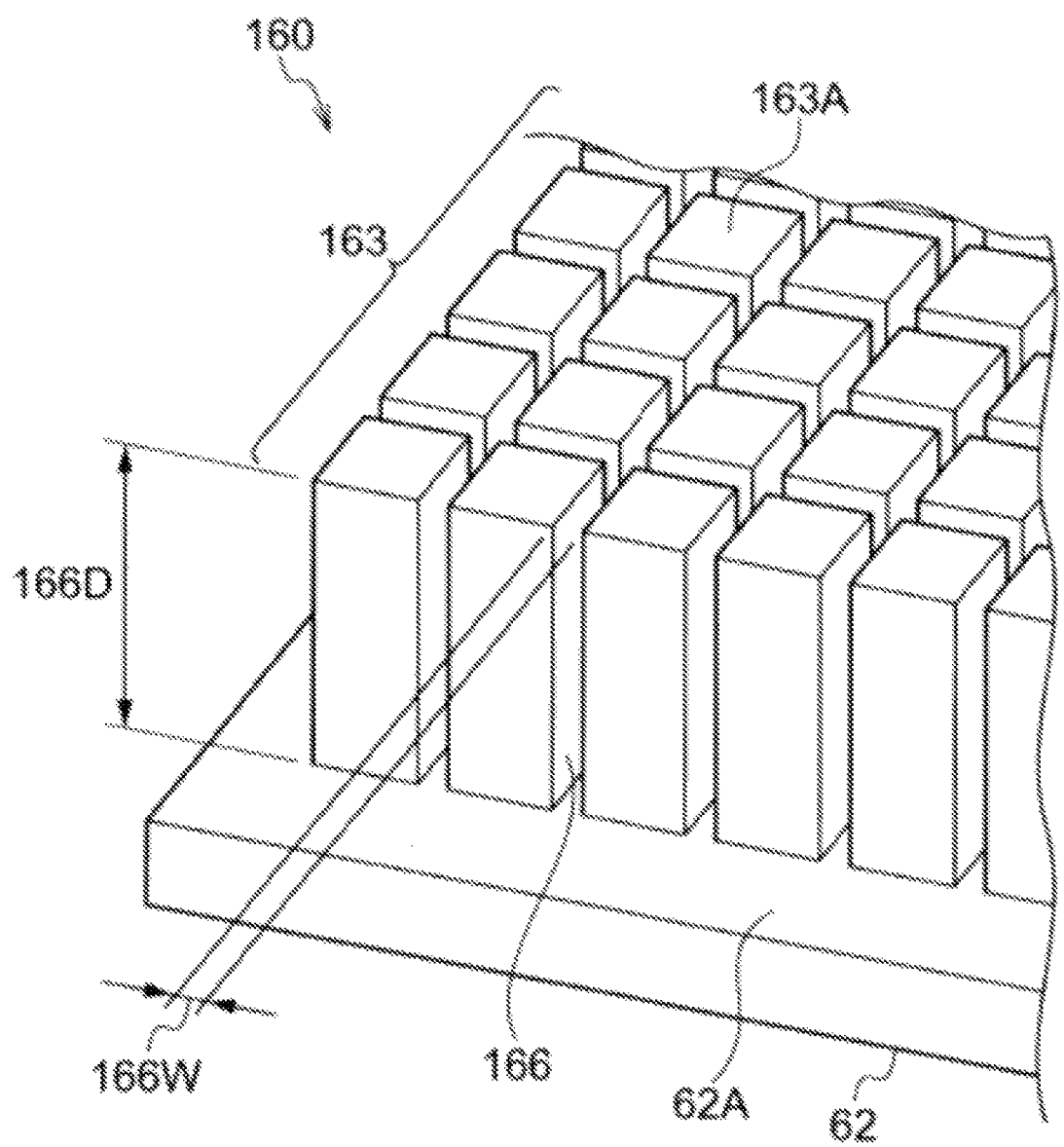
FIG. 12 is a partially enlarged perspective view of a heat transfer unit in a variation example.

A heat transfer unit configured to transfer heat from the electronic component 16 to a refrigerant is not limited to the heat transfer unit 60 and may be a heat transfer unit 160 illustrated in FIG. 12. The heat transfer unit 160 has a plate-like plate section 62 and a cuboid-shaped block section 163 having a plurality of grooves 166 (slits).

When viewed from the upper side (the supply hole 82 side), the plurality of grooves 166 are formed on a top surface 163A (one example of a heat transfer surface) of the block section 163 so that the grooves 166 intersect one another. Specifically, each groove 166 reaches the top surface 62A of the plate section 62 from the top surface 163A of the block section 163. In addition, each groove 166 reaches the back surface from the front surface. Thus, the block sections 63 divide the block section 63 into a plurality of parts. Also in the example illustrated in FIG. 12, groove depth 166D of the grooves 166 (slits) is set to 3 mm, for example. Groove width 166W of the grooves 166 is set to 0.2 mm or more to 0.6 mm or less. Thus, the block section 163 being divided into the plurality of parts, a contact area of the heat transfer unit 160 with a refrigerant increases. In addition, with growth of steam bubbles generated in the grooves 166, the refrigerant in the hot area 60T is agitated, which thus improves the heat transfer performance. This promotes the absorption of heat from the electronic component 16 and the cooling performance of cooling the electronic component 16 is improved.

In addition, a plurality of the variation examples described above may be implemented in combination, as appropriate.

While the embodiments of the technology disclosed by this application have been described above, the technology disclosed by this application is not limited to the above. It is needless to say that in addition to the above, the embodiments may be variously modified and carried out without departing from the scope of the embodiments.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An evaporator comprising:
    a housing in which an evaporator chamber configured to evaporate a refrigerant is formed;
    a heat transfer surface provided on an inner wall of the housing and having a hot area which is a part that becomes hot due to heat transferred from a heating element to the housing; and
    a supply port formed in the housing, opposed to the hot area and configured to eject the refrigerant supplied from a supply pipe to the hot area,
    wherein a narrow groove is formed in the heat transfer surface, and
    wherein the supply port has a smaller diameter than an inside diameter of the supply pipe in such a manner that the refrigerant is ejected from the supply port by forced convection which is driven by a force of a pump and is spread over the hot area.

2. The evaporator according to claim 1, wherein a port section of the supply port projects into the evaporation chamber.

3. The evaporator according to claim 1,
    wherein groove width of the narrow groove is set so that a steam bubble generated in each of the narrow groove moves toward an opening of the narrow groove while being in touch with opposed side walls of the narrow groove and then expands from the opening of the narrow groove to outside.

4. The evaporator according to claim 1, wherein groove width of the narrow groove is set so that in a side view, the steam bubble expands from an opening of each of the narrow groove to outside with the center of curvature of the steam bubble located outside the narrow groove.

5. The evaporator according to claim 1, wherein a ratio of groove width of the narrow groove to groove depth of the narrow groove is 7% or more to 20% or less.

6. The evaporator according to claim 1, wherein groove depth of the narrow groove is approximately 3 mm and groove width of the narrow groove is approximately 0.2 mm or more to approximately 0.6 mm or less.

7. The evaporator according to claim 1, wherein the refrigerant directly collides against the hot area so as to cause subcool boiling in the hot area.

8. The evaporator according to claim 7, wherein the supply port has an inside diameter ratio to the supply pipe of 40% or more to 90% or less.

9. The evaporator according to claim 1, wherein the supply port is placed right above the hot area.

10. The evaporator according to claim 1, wherein the supply port opens to a center area of the heating element in a planar view.

11. The evaporator according to claim 1, wherein the supply port opens along a direction perpendicular to the heat transfer surface.

12. The evaporator according to claim 1, wherein the evaporation chamber is formed of a single space.

13. The evaporator according to claim 1, wherein the refrigerant mainly contains water.

14. The evaporator according to claim 1, wherein the refrigerant is a defoamed refrigerant.

15. The evaporator according to claim 1, further comprising:
    a discharge path provided to the housing at a position opposed to the heat transfer surface and configured to discharge the boiling refrigerant from the evaporation chamber.

16. The evaporator according to claim 1, wherein the heat transfer surface has a plurality of the hot areas, and
    wherein the supply ports are provided in the same number as the hot areas, and are opposed to the respective hot areas on a one-to-one basis.

17. The evaporator according to claim 1, wherein a plurality of the narrow grooves are formed in the hot areas so that the narrow grooves intersect one another when viewed from the supply port.

18. The evaporator according to claim 1, wherein the supply port includes an insertion unit into which a tip of the supply pipe is inserted from an outer wall of the housing and a supply unit having a choke between the insertion unit and the inner wall of the housing, and a diameter of the choke is smaller than a diameter of a portion of the supply unit at the insertion unit and a diameter of a portion of the supply unit at the inner wall of the housing.

19. A cooling device comprising:
    an evaporator;
    a condenser configured to cool and liquefy a refrigerant in a gaseous state fed from the evaporator; and
    a pump configured to feed the refrigerant liquefied by the condenser to the evaporator;
    wherein the evaporator comprises:
    a housing in which an evaporation chamber configured to evaporate the refrigerant is formed;
    a heat transfer surface provided on an inner wall of the housing and having a hot area which is a part that becomes hot due to heat transferred from a heating element to the housing; and
    a supply port formed on the housing, opposed to the hot area and configured to eject the refrigerant supplied from a supply pipe to the hot area,
    wherein a narrow groove is formed on the heat transfer surface, and
    wherein the supply port has a smaller diameter than an inside diameter of the supply pipe in such a manner that the refrigerant is ejected from the supply port by forced convection which is driven by a force of the pump and is spread over the hot area.

20. The cooling device according to claim 19, wherein the pump is placed at a position lower than the evaporator.

21. The cooling device according to claim 19, wherein the refrigerant directly collides against the hot area so as to cause subcool boiling in the hot area.

22. The cooling device according to claim 19, wherein the supply port includes an insertion unit into which a tip of the supply pipe is inserted from an outer wall of the housing and a supply unit having a choke between the insertion unit and the inner wall of the housing, and a diameter of the choke is smaller than a diameter of a portion of the supply unit at the insertion unit and a diameter of a portion of the supply unit at the inner wall of the housing.

23. An electronic device comprising:
    an electronic component;
    an evaporator;
    a condenser configured to cool and liquefy a refrigerant in a gaseous state fed from the evaporator; and
    a pump configured to feed the refrigerant liquefied by the condenser to the evaporator,
    wherein the evaporator comprises;
    a housing in which an evaporation chamber configured to evaporate the refrigerant is formed;

a heat transfer surface provided on an inner wall of the housing and having a hot area which is a part that becomes hot due to heat transferred from a heating element to the housing; and a supply port formed on the housing, opposed to the hot area and configured to eject the refrigerant supplied from a supply pipe to the hot area, wherein a narrow groove is formed on the heat transfer surface, and wherein the supply port has a smaller diameter than an inside diameter of the supply pipe in such a manner that the refrigerant is ejected from the supply port by forced convection which is driven by a force of the pump and is spread over the hot area.

24. The electronic device according to claim 23, wherein the refrigerant directly collides against the hot area so as to cause subcool boiling in the hot area.

25. The electronic device according to claim 23, wherein the supply port includes an insertion unit into which a tip of the supply pipe is inserted from an outer wall of the housing and a supply unit having a choke between the insertion unit and the inner wall of the housing, and a diameter of the choke is smaller than a diameter of a portion of the supply unit at the insertion unit and a diameter of a portion of the supply unit at the inner wall of the housing.

\* \* \* \* \*